United States Patent [19]

Berry

[11] 4,387,829
[45] Jun. 14, 1983

[54] COMBINATION BREATHER-DRAIN

[75] Inventor: Richard C. Berry, Camillus, N.Y.

[73] Assignee: Cooper Industries, Inc., Houston, Tex.

[21] Appl. No.: 337,555

[22] Filed: Jan. 6, 1982

[51] Int. Cl.³ .............................................. B65D 51/16
[52] U.S. Cl. .................................. 220/374; 220/88 A
[58] Field of Search ...................... 220/88 A, 366, 373, 220/374; 222/451

[56] References Cited

U.S. PATENT DOCUMENTS 3,841,520 10/1974 Bryant et al. ........................ 220/374
3,931,455 1/1976 Burnell ................................ 220/374

Primary Examiner—George T. Hall

Attorney, Agent, or Firm—Sughrue, Mion, Zinn, Macpeak and Seas

[57] ABSTRACT

The combination breather-drain is designed to be disposed in the bottom of an explosion proof housing to facilitate the drainage of moisture from the housing by gravity while simultaneously providing an atmospheric communication with the interior of the housing through a separate passage. The passage for the drainage of moisture is defined by a loose threaded connection between a hollow cylindrical plug and a fitting secured to the bottom of the housing. The threaded connection is so dimensioned as to prevent the passage of a flame through the threaded connection. A plurality of baffles or a solid threaded plug are provided in the interior of the hollow cylindrical plug to provide an air passage so dimensioned as to prevent the passage of the flame therethrough.

7 Claims, 2 Drawing Figures

COMBINATION BREATHER-DRAIN

BACKGROUND OF THE INVENTION

The present invention is directed to a combination breather-drain suitable for use with explosion proof electrical housings and conduits.

An example of a condensation drain for explosion proof fittings is shown in the U.S. Patent to Hardage No. 2,297,830. This condensation drain is adapted to be arranged in the bottom wall of an enclosed explosion proof switch housing and is comprised of a body formed with a passage extending therethrough and adapted to communicate with the interior of the housing. The passage is formed with axially spaced apart portions threaded internally in step pitch. A stem formed with axially spaced apart portions having external threads thereon in step pitch complimentary to the threaded portions of the passage is threaded into the body. The portion of the stem intermediate the threaded portions is of reduced cross-section and the threaded portions of the stem are so spaced that when one threaded portion of the stem is moved out of engagement with the complimentary threaded portion of the passage, the other threaded portion of the stem is in threaded engagement with the other threaded portion of the passage. The stem is provided with stop means cooperable with the body to prevent disengagement of both threaded portions simultaneously. With this construction, there is constant drainage between the threads of the innermost threaded portion and since the lower threaded portions are out of engagement, the condensate can be readily drained. Over a long period of time, the passage between the innermost threaded portions may become filled up or plugged with foreign matter, in which event it is necessary to screw the stem inwardly threading the innermost portion of the stem out of engagement with its complimentary threaded portion and in so doing cleaning the thread connections. During this operation, the outermost threaded portion 21 of the stem will be threaded into the lower end of the body and thus a flame tight joint will be established at the lower end of the body previous to the time the flame tight joint at the upper end of the body is broken. Since the condensation drain is located in the bottom of the explosion proof fitting, there is no provision made for the introduction of ventilating air into the interior of the fitting.

It is also known in the art to provide a universal fitting for explosion proof housings which can act either as a breather or a condensation drain depending upon its location in the explosion proof housing. The universal fitting may be comprised of a plug-type device having a threaded clearance sufficiently small to be explosion proof, but open enough to allow air or water to pass. When this device is located in the bottom of an explosion proof housing, it will act as a drain and when mounted in the top of the housing, it will act as a breather or air vent. The universal fitting may also consist of a series of metal baffles assembled in series instead of a threaded passage. The baffles are so arranged as to render the construction explosion proof while providing a lower resistance to the passage of air and water. Once again, this type of universal fitting can be mounted either in the bottom of the explosion proof housing or the top depending upon its desired function.

In many instances, it is undesirable to use such a universal fitting as a breather on the top of an explosion proof housing that is exposed to driving rain or hose-down operations because of the possibility of the entry of water through the top breather. However, when only a bottom drain is used without a breather on top, the free drainage of condensed water from the enclosure may not occur.

SUMMARY OF THE INVENTION

The present invention provides a new and improved combination breather-drain which overcomes all of the shortcomings of the aforementioned prior art devices.

The present invention provides a new and improved combination breather-drain which will provide both functions in a single assembly mounted in the bottom of an enclosure. The combination breather-drain utilizes a coaxial configuration of elements employing a threaded construction for the outer moisture drain and a baffle construction for the inner vent. Alternatively, a threaded type construction could be substituted for the baffle type inner vent especially in hazardous locations where metal dusts or hydrogen are present. Means may be provided for rotating the drainage plug for a limited extent relative to the fitting for the purpose of clearing the threads should they become clogged with foreign matter.

The foregoing and other objects, features and advantages of the invention will be apparent from the following more particular description of a preferred embodiment of the invention as illustrated in the accompanying drawings.

DETAILED DESCRIPTION OF THE INVENTION

Figure 1:
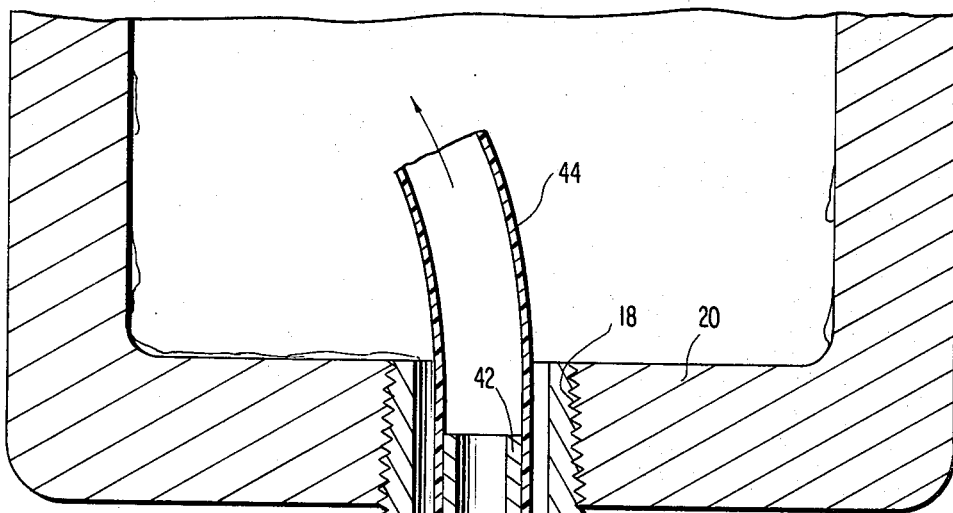
FIG. 1 is a side elevation view, partly in section, showing a combination breather-drain according to a first embodiment of the present invention.

The combination breather-drain as shown in FIG. 1 is comprised of a hollow cylindrical fitting 12 having a reduced diameter portion 14 with external threads 16 thereon. The reduced diameter portion of the fitting 12 is threaded into a complimentary threaded opening 18 in the bottom wall 20 of an explosion proof housing. If the thickness of the bottom wall 20 is insufficient to obtain the required number of threads to meet the explosion proof requirement, a separate fitting (not shown) may be provided in the aperture and secured therein by any suitable means such as welding or the like which will render the connection explosion proof.

A hollow cylindrical plug 22 is provided with external threads 24 which mate with complimentary threads 26 on the internal surface of the fitting 12. The threaded connection provided by the threads 24 and 26 is sufficiently loose so as to allow the free drainage of moisture downwardly therethrough as the condensed water drains from the bottom of the housing through the portion 14 of the fitting 12. A plurality of baffles are located within the interior of the plug 22. The baffles are sufficient in number and have an appropriate configuration so as to permit the free passage of air while preventing the passage of flame thereby rendering the passage explosion-proof. More specifically the baffles are comprised of a plurality of cup-like members 29 stacked upon one another in the hollow cylindrical plug 22 with the open ends thereof facing upwardly. Each member 29 is provided with a central aperture 29a. With the exception of the uppermost member 29 a disc 28 is located in each cup-like member 29. Each disc 28 is provided with a plurality of oppositely facing dimples 28a sufficient to support each disc 28 in spaced relation to the bottom of each member 29. The diameters of the discs 28 are less than the internal diameters of the cup-like members 28 so as to permit the flow of air through the baffle arrangement. The plug 22 is provided with a bottom wall 30 having a hollow cylindrical projection 32 extending therefrom to provide atmospheric communication with the interior of the plug. A suitable handle 34 is provided with an aperture 36 having a non-circular configuration complimentary to the non-circular exterior surface of the projection 32 so as to non-rotatably mount the handle thereon. The handle is secured on the projection 32 by means of a threaded nut 38 or the like. Should the passage between the threads 24 and 26 become clogged with foreign matter, it is possible to rotate the plug 22 by means of the handle 34 to clear the threads. A projection 40 is provided on the fitting 12 to limit the rotational movement of the plug 22 within the fitting 12 to prevent the removal of the plug therefrom.

The opposite end of the plug 22 is provided with a tubular sleeve 42 which communicates the interior of the plug with the interior of the explosion proof housing. A plastic tube 44 is fitted tightly over the sleeve 42 and extends upwardly into the housing a sufficient distance so as to prevent the entry of water condensation into the interior of the plug 22. Should the baffles 28 in the interior of the plug 22 become clogged with foreign matter, the application of high pressure air to the vent passage through the projection 32 will clear the baffles and exhaust any accumulated water through the outer threads.

Figure 2:
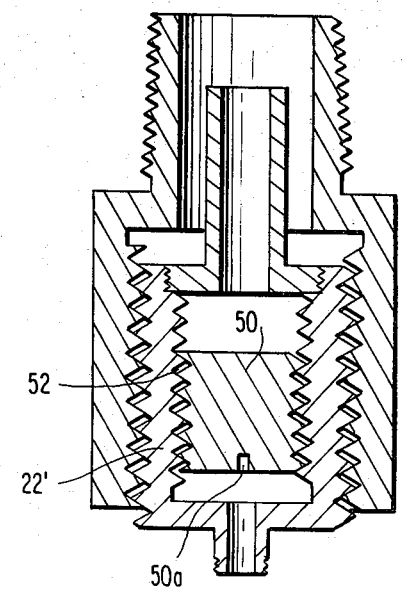
FIG. 2 is a partial view similar to FIG. 1 showing a combination breather-drain according to a second embodiment of the present invention.

In a hazardous environment containing metal dusts or hydrogen the baffles of FIG. 1 would not provide sufficient protection against possible explosions. Therefore, in the construction shown in FIG. 2, the plug 22' is provided with a solid plug 50 in the interior thereof in lieu of the baffles 28. The plug 22' and the plug 50 are provided with complimentary threads 52 having sufficient clearance to allow the passage of air from the atmosphere into the interior of the explosion proof housing. A number of threads and the clearances are sufficient to meet the explosion proof standards which are well known in the industry. Should the complimentary threads 52 become clogged with foreign matter they could be cleared either by the application of high pressure air as with the previous embodiment or a suitable tool could be inserted through the passage in the projection 32 for engaging a complementary notch or hole 50a for rotating the solid plug 50 relative to the hollow plug 22' to clear the threads.

While the invention has been particularly shown and described with reference to preferred embodiments thereof, it will be understood by those in the art that the foregoing and other changes in form and detail may be made therein without departing from the spirit and scope of the invention. For example the plug 22 or 22' may be threaded directly into the bottom of the housing.

What is claimed is:

1. A combination breather-drain comprising hollow cylindrical plug means having external threads for threaded engagement with a threaded aperture in the bottom wall of an explosion proof housing, said threaded engagement having sufficient clearance to allow the passage of water therethrough and a sufficient number of turns to render the threaded connection explosion proof and air passage means located within said hollow cylindrical plug means permitting the passage of air from the exterior of the housing to the interior of the housing while maintaining said housing explosion proof.

2. A combination breather-drain as set forth in claim 1, further comprising tubular means connected to said hollow tubular plug at one end thereof with the opposite end adapted to extend into said housing above the bottom thereof for communicating atmospheric air to the interior of said housing while preventing the entry of condensed water therein.

3. A combination breather-drain as set forth in claim 1, further comprising means for rotating said hollow cylindrical plug relative to said aperture to clear said threaded connection should blockage occur and stop means for limiting the rotation of said plug.

4. A combination breather-drain as set forth in claim 1, wherein said air passage means is comprised of a plurality of baffles secured within said hollow tubular plug and defining an explosion proof air passage.

5. A combination breather-drain as set forth in claim 1, wherein said air passage means is comprised of an additional solid plug located within said hollow cylindrical plug, said hollow cylindrical plug and said solid plug having complimentary threaded engaging means having sufficient clearance providing for the passage of air while preventing the passage of a flame front.

6. A combination breather-drain as set forth in claim 1 further comprising a hollow cylindrical fitting adapted to be connected to the bottom of said explosion proof housing, said hollow cylindrical fitting having internal threads to define said threaded aperture.

7. A combination breather-drain as set forth in claim 6 further comprising means for rotating said cylindrical plug relative to said fitting to clear said threaded connection should blockage occur and stop means on said fitting to limit the rotation of said plug relative to said fitting.

* * * * *